United States Patent
Ould-Cheikh-Mouhamedou

(10) Patent No.: US 8,751,907 B2
(45) Date of Patent: Jun. 10, 2014

(54) JOINT ENCODING AND DECODING METHODS FOR IMPROVING THE ERROR RATE PERFORMANCE

(75) Inventor: Youssouf Ould-Cheikh-Mouhamedou, Riyadh (SA)

(73) Assignee: King Saud University, Riyadh (SA)

( * ) Notice: Subject to any disclaimer, the term of this patent is extended or adjusted under 35 U.S.C. 154(b) by 0 days.

(21) Appl. No.: 13/822,631

(22) PCT Filed: Feb. 14, 2011

(86) PCT No.: PCT/US2011/024811
§ 371 (c)(1),
(2), (4) Date: Mar. 12, 2013

(87) PCT Pub. No.: WO2012/036754
PCT Pub. Date: Mar. 22, 2012

(65) Prior Publication Data
US 2013/0185610 A1    Jul. 18, 2013

(51) Int. Cl.
*H03M 13/00*    (2006.01)
(52) U.S. Cl.
USPC ............................................. 714/774
(58) Field of Classification Search
USPC ............................................. 714/774
See application file for complete search history.

(56) References Cited

U.S. PATENT DOCUMENTS

| | | | |
|---|---|---|---|
| 6,374,386 B1 | 4/2002 | Kim et al. | |
| 6,397,367 B1 | 5/2002 | Park | |
| 7,934,143 B1 * | 4/2011 | Wu et al. | 714/769 |
| 2008/0107192 A1 * | 5/2008 | Mukkavilli et al. | 375/260 |
| 2009/0249165 A1 | 10/2009 | Gracie et al. | |
| 2010/0275097 A1 * | 10/2010 | Choi et al. | 714/758 |

FOREIGN PATENT DOCUMENTS

EP    2204913    7/2010

* cited by examiner

*Primary Examiner* — Albert DeCady
*Assistant Examiner* — Enam Ahmed
(74) *Attorney, Agent, or Firm* — Richard C Litman

(57) ABSTRACT

Joint encoding and decoding methods for improving the error rate performance are described. In one aspect, the systems and methods determine values and positions of L desired symbols. In encoding unit receives data symbols for encoding. The encoding unit calculates, responsive to receiving the data symbols, values and positions of H help symbols. The encoding unit inserts the help symbols into the data symbols at respective help symbols positions, thereby generating new data symbols. Encoding unit encodes the new data symbols to produce a codeword C' that contains the L desired symbols. The codeword C' is communicated to a decoder that is instructed to explore some or all L desired symbols in C'.

4 Claims, 9 Drawing Sheets

JOINT ENCODING AND DECODING METHODS FOR IMPROVING THE ERROR RATE PERFORMANCE

BACKGROUND

Error-correcting codes are used in a variety of systems such as communication and data storage systems to achieve high data reliability. A typical error correction coding code consists of an encoder and decoder.

FIG. 1 shows a prior art system 100 with conventional data input/output (I/O) and generic encoder 102. As illustrated, generic encoder 102 typically accepts as an input a set of data symbols, U 104, consisting of Z symbols, where the Z=K+T symbols are the sum of K information symbols (i.e., raw symbols that need to be transmitted) and possible T overhead symbols (i.e., extra symbols for error detection and/or trellis termination for convolutional and turbo codes). Some encoders 102 such as convolutional encoder do not require the data symbols to be of fixed length; the data symbols can be theoretically of infinite length. Encoder 102 maps the input U 104 according to well-defined rules to a codeword C 106 of length N data symbols. The ratio Q=K/N is the code rate. If higher code rates are needed, puncturing can be used to delete some of the N data symbols in C 106. If the code is systematic, then C 106 will include the entire set of data symbols, U, as well as a set of redundant parity symbols, P. If the code is non-systematic, then C 106 will contain only a set of parity symbols, P. It is also possible to have partially systematic codes, either by design, or for example when puncturing is used to delete some of the data and parity symbols in a systematic code to obtain a higher code rate. In this case, the punctured codeword 106 will contain a subset of U and a subset of P.

FIG. 2 shows a conventional decoding system 200 with a soft-in soft-out (SISO) decoder 202. The SISO decoder typically operates on a set of received hard or soft values, V 204 that have a correspondence to the symbols in a transmitted codeword, C 106 (FIG. 1). It also accepts a separate set of soft a priori information values, A 206, that have a correspondence to some or all of the data symbols in U 104 and/or P (e.g., in a codeword 106). On the other hand, the SISO decoder 202 outputs a set of hard decisions, D 208. The decisions in D usually correspond either to hard estimates of the data symbols in U or to hard estimates of the symbols in the entire codeword, C. Decoder 202 also outputs soft reliability values, R 210, corresponding to some or all of the hard decisions in D. The values in inputs V and A are often expressed in log-likelihood-ratio (LLR) format and, if independent or assumed to be independent, can simply be viewed as additive information.

Examples of powerful error-correcting codes are turbo codes, turbo product codes, and low-density parity-check (LDPC) codes. For explanation and comparison purposes, parallel turbo codes are used as representative error-correcting codes. FIG. 3 shows a common parallel turbo-code encoder 300 consisting of two recursive systematic convolutional (RSC) encoders 302 and 304 in parallel, an interleaver 306 to scramble data symbols, and a puncturing unit 308 to achieve higher code rates. The data symbols 104 are fed to RSC1 encoder 302 to generate the first set of parity symbols. An interleaved version of the data symbols 104 is fed to RSC2 encoder 304 to generate the second set of parity symbols. All three sets, namely, the data symbols, the first set of parity symbols, and the second set of parity symbols are passed to the puncturing unit 308 to produce the systematic (or partially systematic) part, S 310, the first parity part, P1 312, and the second parity part, P2 314, respectively.

The turbo decoding process is usually performed in an iterative manner by exchanging soft decoding information (i.e., extrinsic information) between the constituent soft-in soft-out (SISO) decoders. This way, each constituent decoder takes advantage of the extrinsic information produced by the other decoder at the previous step. The core of each constituent decoder is based on a SISO algorithm such the one depicted in FIG. 2. In classical systematic turbo decoder, for example, the values in V 204 provide information about the symbols in both U 104 and parity parts (P1 312 or P2 314), and the values in A 206 provide additional a priori information about the data symbols in U 104, but not necessarily about the parity symbols (P1 312 or P2 314). Note that the reliability values at the output of the decoder are useful when the given decoder is part of a concatenated or iterative decoding scheme. This is the case for turbo and turbo-like decoders where the a priori information used by one constituent decoder is derived from the reliability values produced by one or more other constituent decoder(s). Examples of soft output decoding algorithms include the log a posteriori probability (log-APP) and max-log-APP algorithms.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Joint encoding and decoding methods for improving the error rate performance are described. Error rate performance is a measure for the number of errors in decoded packets/sequences. Error rate performance may be reported as packet error rate (PER) and/or bit error rate (BER). In one aspect, the systems and methods determine values and positions of L desired symbols. In encoding unit receives data symbols for encoding. The encoding unit calculates, responsive to receiving the data symbols, values and positions of H help symbols. The encoding unit inserts the help symbols into the data symbols at respective help symbols positions, thereby generating new data symbols. Encoding unit encodes the new data symbols to produce a codeword C' that contains the L desired symbols. Both, the encoding unit and decoding unit know about the L desired symbols. The codeword C' is communicated to a decoder that is instructed to explore some or all L desired symbols in C'.

BRIEF DESCRIPTION OF THE DRAWINGS

The detailed description is set forth with reference to the accompanying figures, in which the left-most digit of a reference number identifies the figure in which the reference number first appears. The use of the same reference numbers in different figures indicates similar or identical items or features.

DETAILED DESCRIPTION

Overview

Figures 1, 2:
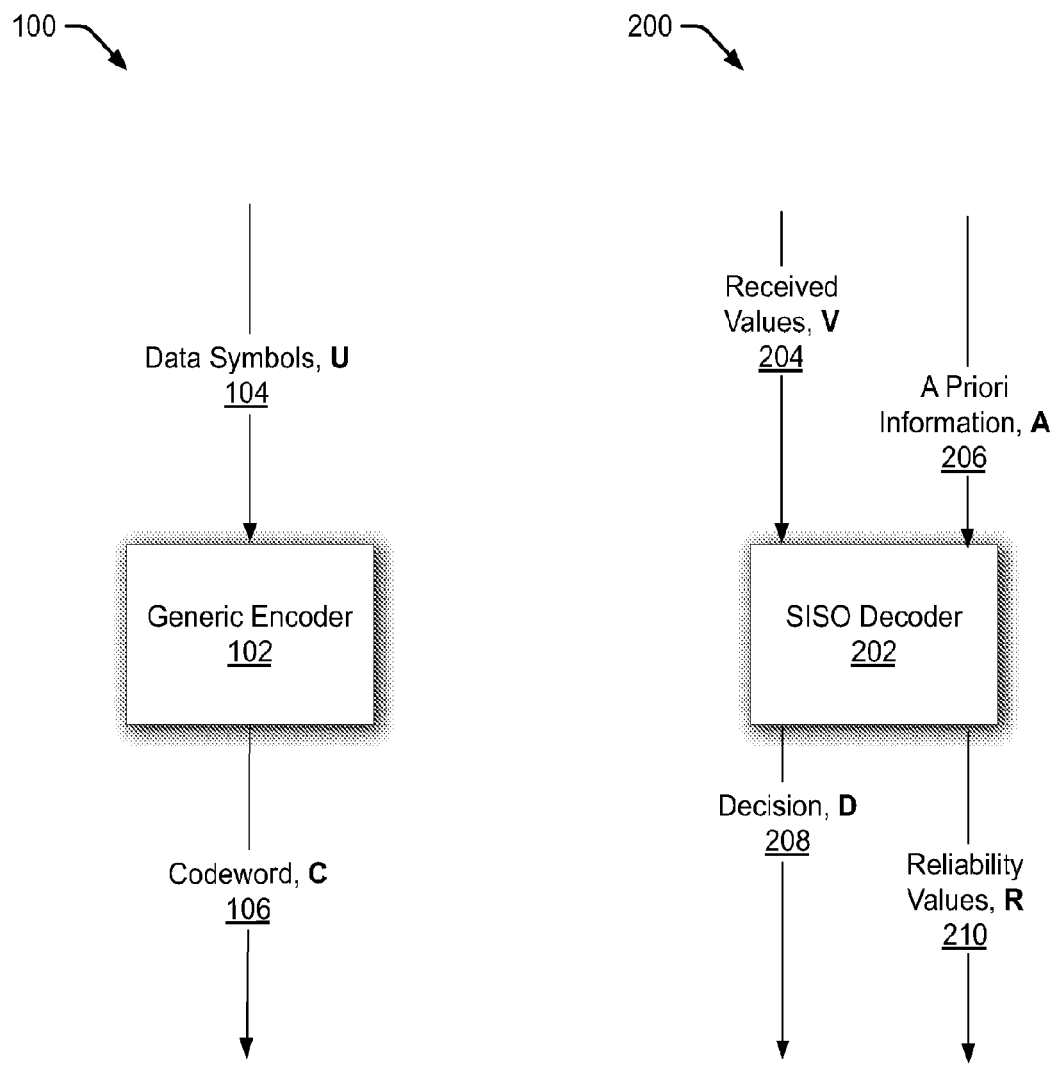
FIG. 1 is a block diagram illustrating a prior art generic encoder and corresponding input/output (I/O) data flow.
FIG. 2 is a block diagram illustrating a prior art generic soft-in soft-out (SISO) decoder and corresponding I/O data flow.
Figure 3:
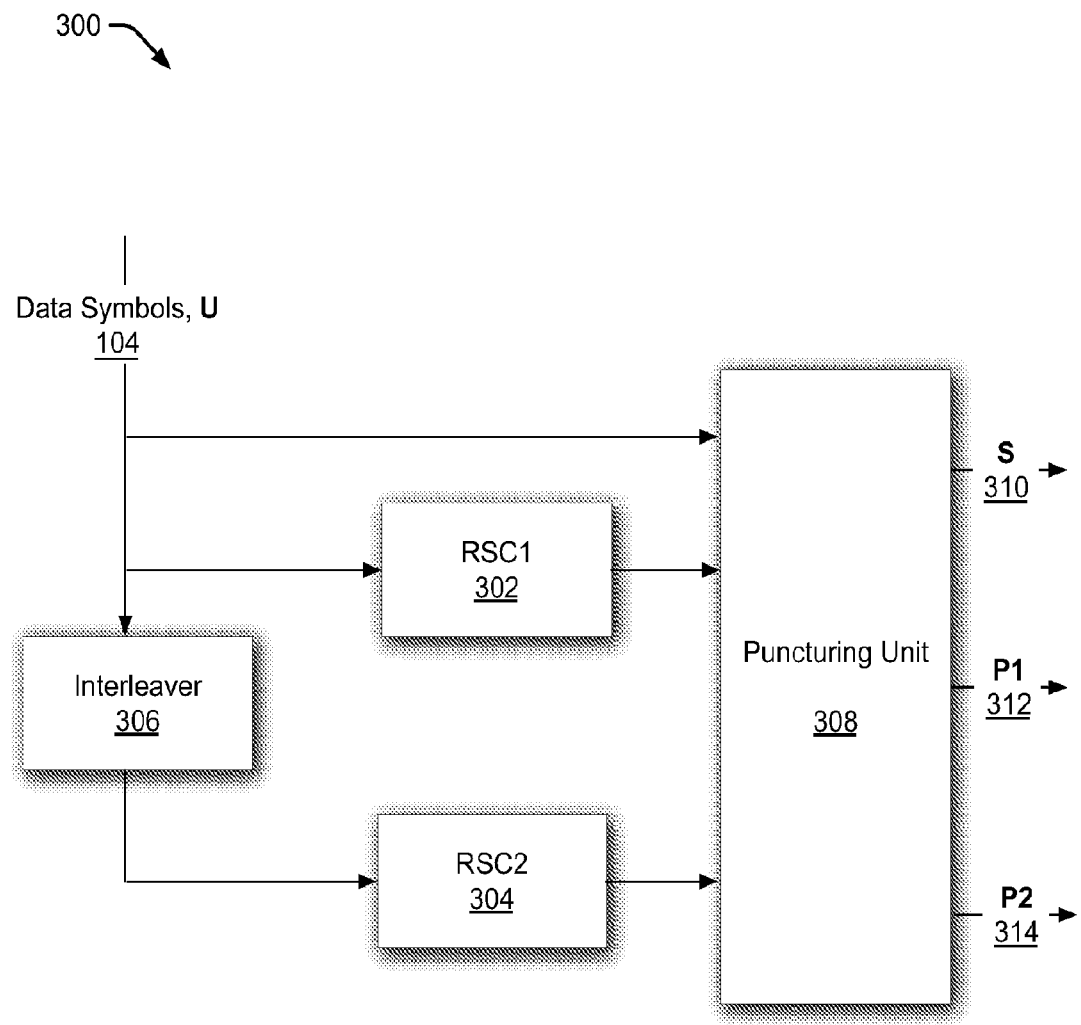
FIG. 3 is a block diagram showing a common prior art parallel turbo-code encoder.

Turbo code error rate performance is generally characterized by two main regions: a waterfall region and an error floor region. The waterfall region is associated with low to moderate signal-to-noise ratio (SNR) values. In this region, the slope of the error-rate curve drops rapidly as the SNR increases. The error floor region is associated with moderate to high SNR values. In this region, the error-rate curve suffers from severe flattening or flaring, making it difficult to improve error rate performance without a significant increase in the SNR.

It is desirable to have turbo codes that provide steep slopes in the waterfall region that begin at low SNRs and have very low error floors. The design of such turbo codes is challenging. This is partly because conventional design criteria for the waterfall and error floor regions are based on different approaches. In the waterfall region, Extrinsic Information Transfer (EXIT) chart analysis can be used to help predict the SNR at which the waterfall region begins, and to estimate the bit error rate (BER) after an arbitrary number of iterations. In the error floor region, where the error rate performance is mainly determined by the distance properties of the code, the standard way to lower the error floor is to increase the minimum distance (dmin) of the code and/or reduce the number of codewords (multiplicity) at dmin. To improve the distance properties, it is conventional to use a well-designed interleaver. However, the design of such interleavers is typically a complex and time-consuming task. Moreover, there are theoretical and practical limits to the dmin and multiplicity values, and as a result, the improvements in floor performance generally achieved.

The following described systems and methods for improved error rate performance address these and other limitations of conventional encoding and decoding systems and techniques. More particularly, the systems and methods include three phases: The initial phase is the determination of L symbols (called "desired symbols") which will be included in every codeword C'. In particularly, a) the size, L, of the desired symbols, b) the values of the desired symbols, and c) the positions $j_1, j_2, \ldots j_L$ of the desired symbols need to be determined in a such a way that the error rate performance is improved. Distance measurement methods and/or error rate performance results can be utilized to determine a), b), and c). The values a), b), and c) are applied to every codeword C'.

Thus, this phase is done only once at the begin of design phase. Note that once the a), b), and c) are determined, their values are shared to the decoder.

It is now assumed that the L desired symbols and their positions have already been determined in the initial phase. The second phase, namely the encoding phase, involves 1) the determination of H symbols (called "Help symbols")—which are a priori unknown—, 2) the determination of the positions $i_1, i_2, \ldots, i_H$ of the H help symbols, 3) the insertion of the H help symbols into the received data symbols U of Z symbols to form new data symbols U' of Z'=Z+H symbols that have the H help symbols at position $i_1, i_2, \ldots, i_H$, 4) the encoding of U' using the existing encoder to generate codeword C', and 5) if needed, the puncturing of C' to achieve a target code rate.

The positions $i_1, i_2, \ldots, i_H$ of the H symbols can be the same for each codeword and can be also codeword dependent (i.e., vary from a codeword to another). The goal of the insertion of the H help symbols is to generate codeword C' that contains the L desired symbols at positions $j_1, j_2, \ldots j_L$ that were determined in the initial phase. That is, when encoding the new data symbols U', the inserted H help symbols will make the encoder produce a codeword C' that automatically contains the L desired symbols at the desired positions $j_1, j_2, \ldots j_L$. Note that the size of the help symbols do not necessarily need be equal to the size of the desired symbols. This is why, the notation "H" help symbols and "L" desired symbols is used.

The new codeword C' is modulated, transmitted over a communication channel, and received at a receiver. It is also possible that the new codeword C' is modulated and recorded/stored on magnetic tapes, floppy disks, hard disk drives, CD-ROM's, DVD's, and the like. The third and last phase deals with the instruction of the decoder to explore the L desired symbols in the codeword C'. Note that there is no need to transmit the L desired symbols in C' because the decoder knows already their values and positions. These and other aspects of the systems and methods for improving the error rate performance are now described in greater detail.

Exemplary Systems

Novel systems and methods for improving the error rate performance via encoding and decoding schemes are now described in reference to FIGS. 4 through 10. The systems and methods address limitations of conventional encoding and decoding techniques. More particularly, the novel systems, in initial phase, determine the values and positions of L desired symbols that will be included in every codeword. Then, when encoding the original data symbols, the values and positions of H help symbols are determined. The H help symbols are inserted into the original data symbol at their corresponding positions to produce new data symbols which when encoded will produce a codeword that contains the L desired symbols. The insertion of the H help symbols into the original data symbols may yield a change in code rate. To keep the code rate unchanged, the systems and methods may puncture the codeword (i.e.; remove some of the symbols from the codeword), if needed. When decoding the received sequence corresponding to the transmitted codeword, the systems and methods instruct a decoder to explore the L desired symbols in the codeword.

These systems and methods improve error rate performance, especially in error floor regions, while leaving an existing encoding structure (e.g., for turbo codes, the constituent encoders, and trellis termination) and decoding structure (e.g., for turbo codes, constituent decoders) essentially unchanged. As such, the exemplary systems and methods may be suitable for use with existing encoder and decoders.

Moreover, improvement of error rate performance may reduce transmitter power for applications with low error rate requirements such as those in areas of fiber optic communications, magnetic recording, communication systems, and/or so on.

An Exemplary System for Encoding

Two phases, I and II, are discussed in this section. The first phase, phase I, concerns the design/determination of the values and positions of the L desired symbols. Phase II is the encoding phase which is concerned with determining the values and positions of the H help symbols for each codeword to contain the L desired symbols at their corresponding positions.

Phase I: Determination of the Values and Positions of the L Desired Symbols

Figure 4:
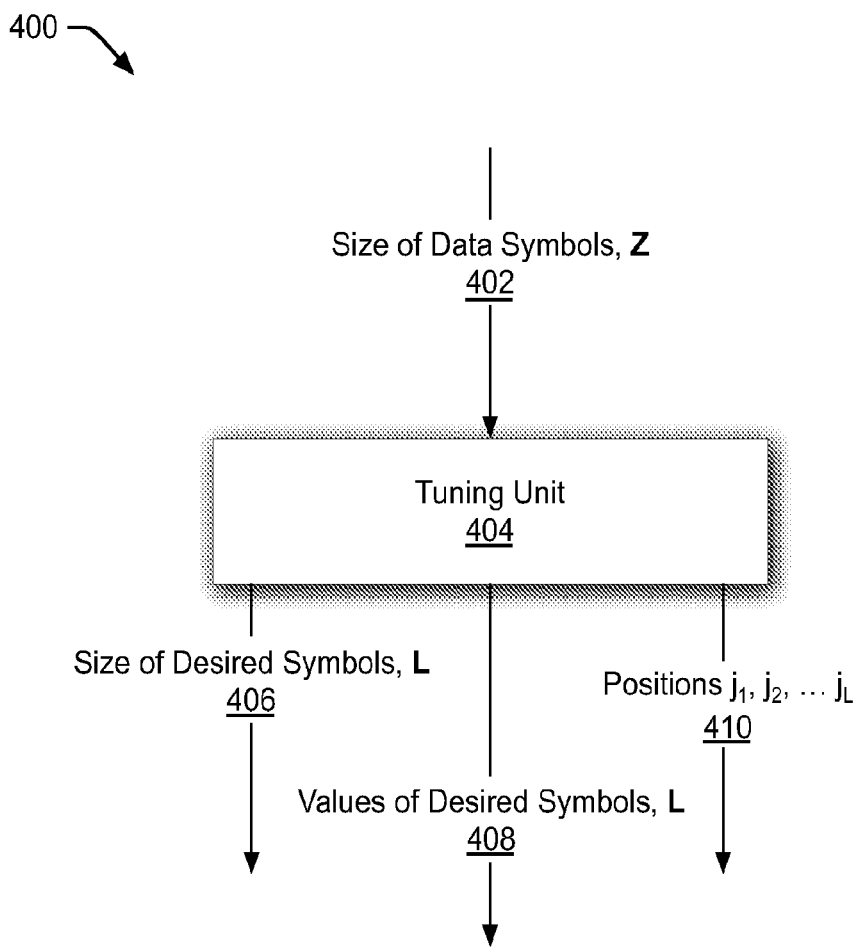
FIG. 4 is a block diagram showing an exemplary tuning system to generate data for encoding, according to one embodiment.

FIG. 4 shows an exemplary tuning system 400 that yields an improved error rate performance, according to one embodiment. In this example, system 400, and more particularly, tuning unit 404 receives the size of data symbols U of Z symbols (i.e., Z=K+T data symbols, K information symbols and possible T overhead symbols for error detection and/or trellis termination for convolutional and turbo codes). In one implementation, each data symbol in U is a single bit that can take on one of two different values (i.e., 0 or 1). In another implementation, each data symbol U comprises multiple bits that can take on corresponding values. The term "data symbol" refers to any one of the symbols entering the encoder 102 (FIG. 1 and FIG. 5).

Figure 5:
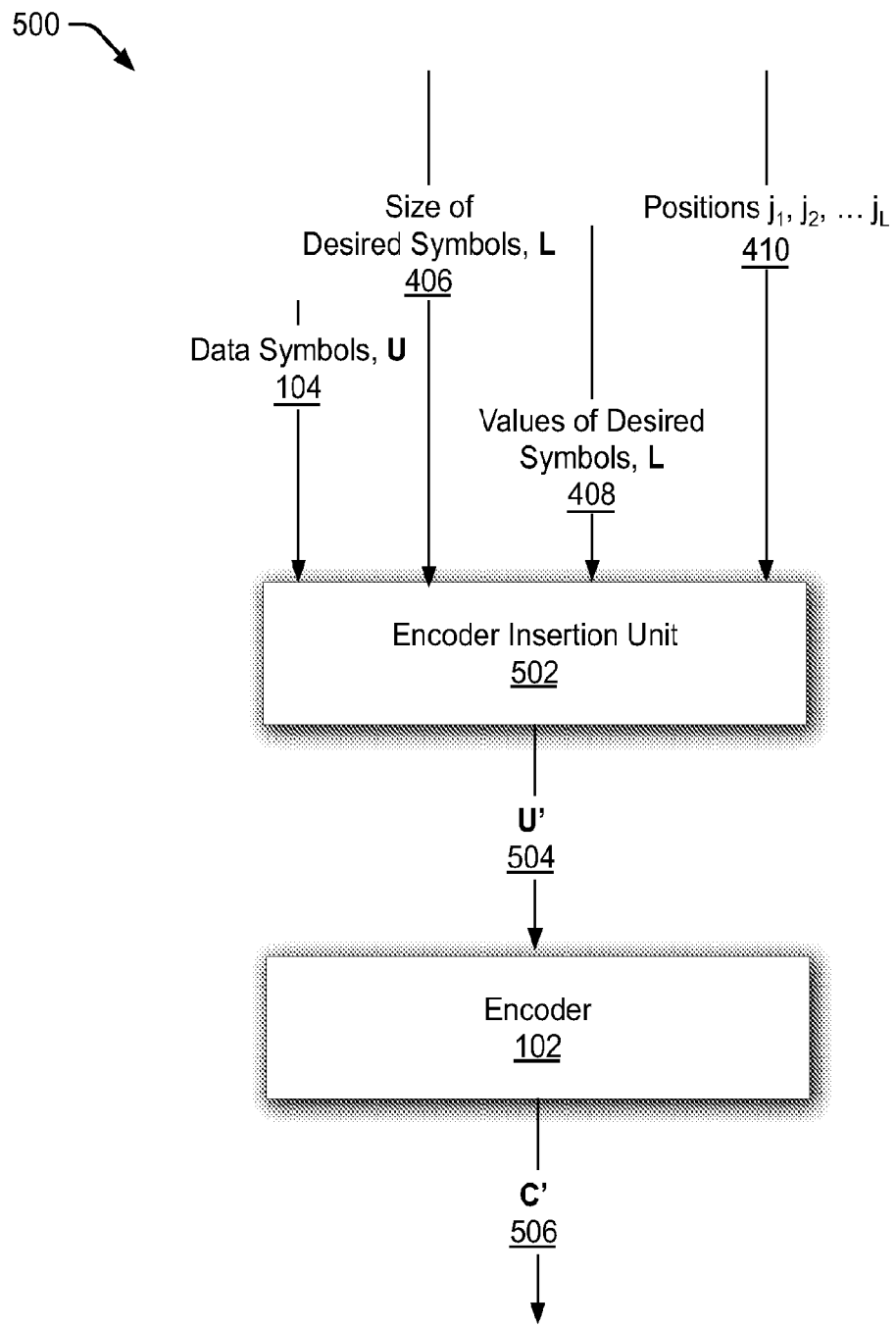
FIG. 5 is a block diagram showing an exemplary encoding system to improve error rate performance, according to one embodiment.

The phase I determines values and positions of L symbols, or "desired symbols", which are to be a part of each new codeword C' (in FIG. 5). It is assumed that the tuning unit 404 knows about the encoder 102 (in FIG. 5) and (optionally) the decoder. To this end, tuning unit 404 accepts as an input the size of data symbols, Z 402, and outputs three quantities: a) the size of the desired symbols, L 406; b) the values of the desired symbols 408; and c) the positions $j_1, j_2, \ldots j_L$ of the desired symbols 410. Once this three quantities a), b) and c) were determined, they are shared to the decoder. This way, there is no need to transmit the L desired symbols because the decoder knows already their values and positions.

The tuning unit 404 can utilize distance measurement methods (DMM) and/or error rate performance (ERP) to determine 406, 408, and 410. For example, quantities a), b) and c) may be chosen such that the Hamming distance spectra of the new code (DSN) with codeword C' (FIG. 5) are better to the Hamming distance spectra of the standard code (DSS) with code C (FIG. 1). The first few terms of the Hamming distance spectra can be computed using a well-known distance measurement method.

In one implementation, tuning unit 404 implements the following steps:
(1) Identifies stopping criteria such as target (first few terms of) Hamming distance spectra, and/or specific error rate performance, and/or upper bound on L;
(2) Sets L to an initial value;
(3) Initializes the values of the L desired symbols (e.g., zero-symbol value for each desired symbol);
(4) Chooses the positions $j_1, j_2, \ldots j_L$ in a random or structured manner;
(5) Applies a distance measurement method to determine the first few terms of the DSN and/or compute error rate performance; and,
(6) If stopping criteria are met: stopping tuning operations; otherwise continuing operations by: (a) going back to 4, or (b) increase L by 1 and go back to 2.

The search for the appropriate positions in a random manner may yield unacceptable complexity, especially when conducting an exhaustive or even semi-exhaustive search, because of the large sampling space. To avoid such complexity, in one implementation the search is conducted in a structured manner. For example, the positions $j_1, j_2, \ldots j_L$ can be constructed through the repeated concatenation of a small number of positions $j_1, j_2, \ldots j_F$ in steps of M positions, where F<=M<<L (i.e., F is smaller than or equal M and both F and M are much smaller than L).

For exemplary demonstration purposes, a single-binary (i.e., each symbol is one bit) turbo code with parity part P=(P1', P2'), where P1' is generated by the new data bits U' (FIG. 5) and P2' by an interleaved version of this new data bits, is assumed. It is also assumed that all L desired bits are taking zero-bit values. For simplicity, it is assumed that the L positions are located in P1'. This why, the insertion of H=L help bits in U' is guaranteed to make P1' contain the L desired bits.

For example, the L desired bits can be constructed in a structured manner using the concatenation of the small structure {x, x, 0, x, x, x, x, 0} a number of times in steps of M=8, where the structure indicates zero-bit value at positions 2 and 7 in P1' and arbitrary value x in {0, 1} at the remaining six positions, assuming the indexing starts at position 0. That is, the L desired bits are to be generated at positions i in P1' where i % 8=2 and i % 8=7 with "%" indicating the modulo operator.

Note that there is no need to transmit the L desired symbols in P1' because it is assumed that the decoder knows already their values and positions, as discussed above.

Phase II: Determination of the Values and Positions of the H Help Symbols

FIG. 5 shows an exemplary encoding system 500 that yields an improved error rate performance, according to one embodiment. In this example, system 500, and more particularly, encoder insertion unit 502 receives, to generate U' 504, input data symbols U 104 of Z symbols along with the sizes 406, values 408, and positions 410 of the L desired symbols. System 500 encodes data symbols, U 104.

The phase II determines values and positions $i_1, i_2, \ldots i_H$ of H symbols, or "desired symbols", and inserts the H symbols into U 104 to form new data symbols U' 504 such that when encoding U' the resulting codeword C' 506 (in FIG. 5) contains the L desired symbols 408 at respective positions $j_1, j_2, \ldots j_L$ 410. In this implementation, the L desired symbols in C' 506 are not transmitted because it is assumed that the decoder knows already their values and positions.

In encoding system 500, the encoder-insertion unit 502 accepts as input the data symbols U 104 of Z symbols and utilizes 406, 408, and 410 to: (a) determines values and positions $i_1, i_2, \ldots i_H$ of H help symbols; and (b) inserts the H help symbols into the received data symbols U 104 at respective and positions $i_1, i_2, \ldots i_H$ to form a new data symbols U' 504 of length Z'=Z+H symbols. The size and values of the help symbols are determined based on the structure of the existing encoder and (optionally) the decoder as well as the size and the locations of the L desired symbols in the codeword C' 506.

The insertion of the H Help symbols into the original data symbols U 104 may yield a change in code rate and consequently puncturing (i.e., removal of some of the symbols in C') may be required, depending on the structure of the exciting encoder. For example, if the existing encoder is completely non-systematic (i.e., does not contain any systematic value) and has a single component encoder, such the case for most standard convolutional encoder, there is no need to apply puncturing. On the other hand, if the existing encoder is a systematic one and/or has more than a single component encoder that operates on the systematic symbols, such the case for standard turbo-code encoder, puncturing need to be applied.

In one implementation, and to achieve desired code rates, encoder 102 of FIG. 5 compensates for any overhead caused by the insertion of the H help into the data symbols U 104 by puncturing C' 506 to remove some of the symbols from C' 506. Depending on the type of encoding and decoding schemes, there are a number of ways to puncture C' to compensate for the overhead caused by the insertion of the help symbols into the data symbols U 104. For example, for turbo codes, puncturing can be achieved by removing all help symbols and their associated unknown parity symbols. In case the insertion of the help symbols in the data symbols U 104 lowers the original code rate, appropriate puncturing can be used to either lower the original coder rates or keep it unchanged.

System 500 produces a codeword C' 506 that is modulated and transmitted over a communication channel to a receiver for decoding. It is also possible that C' 506 is modulated and recorded/stored on medium such as magnetic tapes, floppy disks, hard disk drives, CD-ROM's, DVD's, and the like. For example, at the receiver side, a sequence Y, corresponding to the transmitted codeword C' 506, is received. The sequence Y (illustrated in FIG. 6 as received values V 604) is passed to an exemplary decoding system (e.g., see FIG. 6). Note, the values in V can be simply a copy of the values in Y or log-likelihood-ratio (LLR) values corresponding to Y. The decoding system may also receive a priori information values A (e.g., values A 606 of FIG. 6) that have a correspondence to some or all of the symbols in C' 506.

An Exemplary System for Decoding

Figure 6:
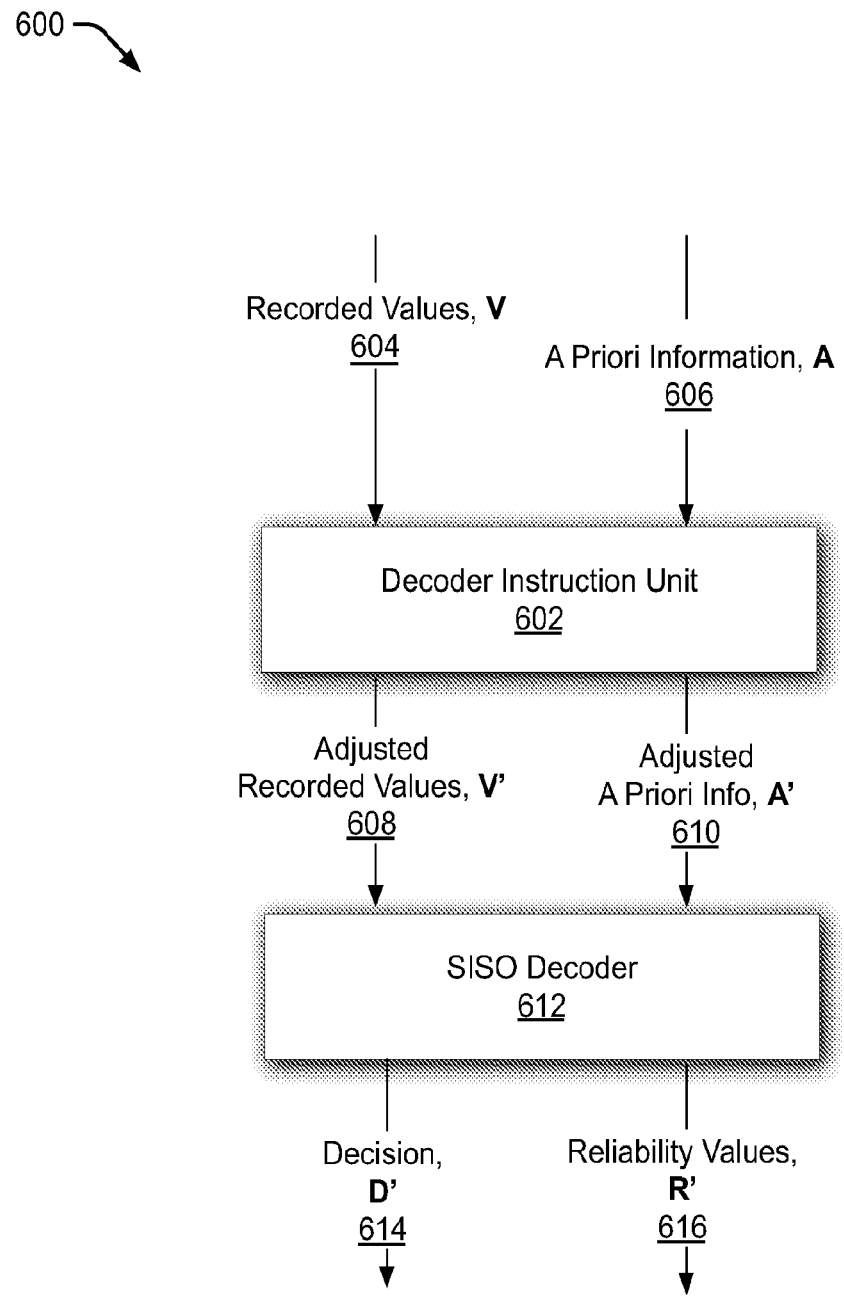
FIG. 6 is a block diagram illustrating an exemplary decoding system, according to one embodiment.

FIG. 6 is a block diagram illustrating an exemplary decoding system 600, according to one embodiment. System 600 includes a decoder instruction unit 602 and a soft-in soft-out (SISO) decoder 612 (e.g., a SISO decoder 202 of FIG. 2). The decoder instruction unit 602 modifies/adjusts the received values in V 604 and/or A 606 to produce adjusted received values V' 608 and/or adjusted a priori information A' 610, respectively. The modification/adjustment of V 604 and/or A 606 is done in such a way so that the SISO decoder 612 can efficiently explore the new values in V' 608 and A' 610 to enhance the error rate performance. The SISO decoder 612 operates on the V' 608 and A' 610 to produce: a) decision D' 614 corresponding either to hard estimates of the data symbols in U' 504 or to hard estimates of the symbols in the entire codeword C' 506; and b) reliability values R' 616 corresponding to some or all of the decisions in D'.

Decoding system 600 can be utilized as a complete decoding system. However, it is especially useful when used as a component decoder in an iterative decoding system. This is because the reliability values R' 616 of a component decoding system can be passed to other component decoding system as a new a priori information A 606. This is the case for turbo and turbo-like decoders where the a priori information A 606 (i.e., extrinsic information) used by one constituent decoder is derived from the reliability values R 616 produced by one or more other constituent decoder(s).

Phase III: Instruction of the Decoder to Explore the L Desired Symbols

The phase III deals with the instruction of decoder to explore the L desired symbols in each codeword C' 506. In one implementation, SISO decoder 612 is instructed to explore the L desired symbols located at positions $j_1, j_2, \ldots j_L$ as follows. Decoder instruction unit 602 inserts/replaces values corresponding to the L desired symbols, in either V 604 and/or A 606, with large (or small/moderate values suitable for hardware implementations) positive or negative (depending on modulation scheme) values (assuming LLR format). In another implementation, the SISO decoder 612 is instructed to explore the L desired symbols by making it reject all symbols that differ from the L desired symbols. For example, in a trellis decoder, specific data symbol values can be rejected by removing their corresponding branches in the trellis or by adjusting their corresponding branch metric values. The SISO decoder 612 can also be instructed to explore the L desired symbols via combination of insertion of large values in V 604 and/or A 606 and rejection of symbols. While there are a number of ways to force a decoder to accept or reject specific data symbol values, the former example of insertion of large values in V 604 and/or A 606 is preferred because it requires no changes to the structure of the SISO decoder 612.

Although FIG. 6 shows decoder instruction unit 602 in a block separate from SISO decoder 612, in one implementation, the decoder instruction unit 602 are implemented in a same logical component. In one implementation, and when decoding, the adjustments by the decoding insertion unit 602 to the received values, V, and/or the a priori information values, A, may not always be done at the beginning of decoding. For example, such adjustment(s) may be done at each or some selected iterations, and the nature of adjustment can change from iteration to another.

Exemplary Implementations and Results

Figure 7A:
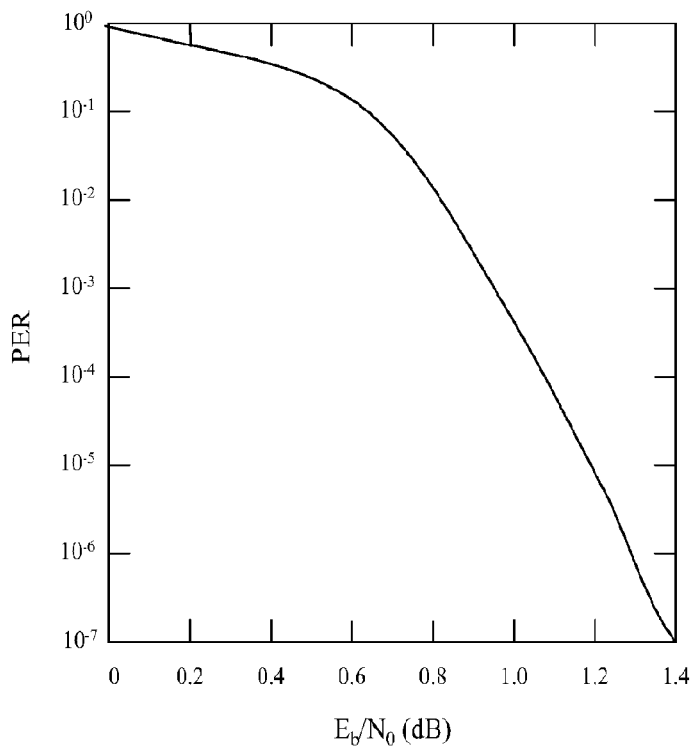
FIG. 7a is a chart illustrating exemplary packet error rate (PER) results of a system for encoding and decoding, according to one embodiment.
Figure 7B:
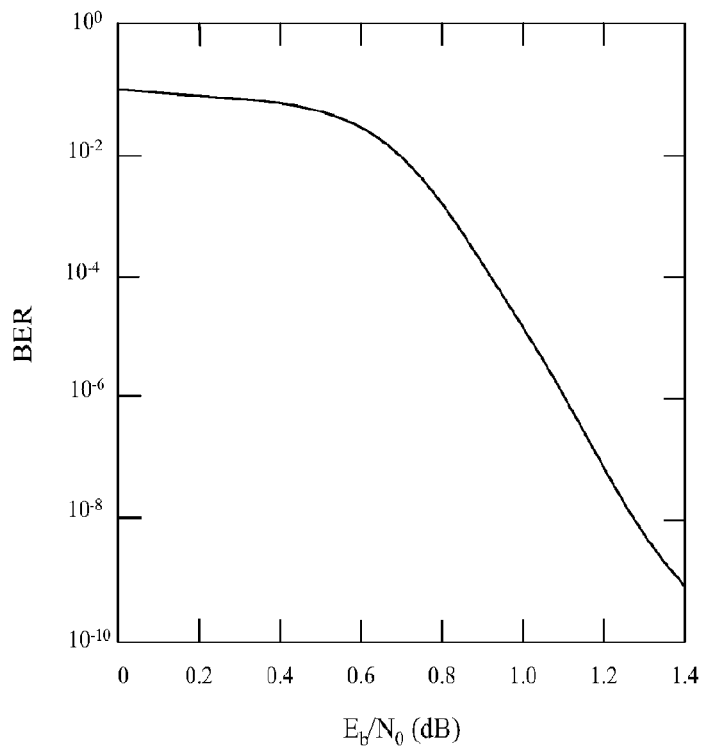
FIG. 7b is a chart illustrating exemplary bit error rate (BER) results of a system for encoding and decoding, according to one embodiment.

FIGS. 7a and 7b respectively show exemplary packet error rate (PER) and exemplary bit error rate (BER) results for improved error rate performance, according to one embodiment. More particularly, these results pertain to an exemplary implementation of the operations described above with respect to FIGS. 4, 5, and 6. In these particular examples, the methodology described herein was implemented with 4-state single-binary turbo codes that use two recursive systematic convolutional (RSC) constituent codes in parallel, where the feedback and feed-forward polynomials of each RSC code are 7 and 5 in octal notation, respectively, and both trellises are terminated using dual termination. For these examples, the L desired bits have zero-bit values and are located at positions i % 16=0, i % 16=3, i % 16=4, i % 16=8, and i % 16=11 in P1' (i.e., using the small structure {0, x, x, 0, 0, x, x, x, 0, x, x, 0, x, x, x, x} of 16 entries repeatedly). Due to dual termination, the actual code rate is 0.33244 which is essentially ⅓. To keep the code rate of ⅓ unchanged all 684 help bits in U' and all parities in P2' that are directly caused by the 684 help bits were removed. Note that the L desired bits in P1' are not transmitted because it is assumed that the decoder knows their values and positions, and consequently do not need to be punctured.

In FIGS. 7a and 7b, the respective PER performance and the BER performance are for a DRP interleaver of length Z=2192 bits (K=1504 information bits, L=684 help bits, and T=4 termination bits) using the method described herein. The PER and BER are for a packet of K=1504 information bits. The signal-to-noise ratio (SNR) is measured in terms of energy per information bit, $E_b$, over the single-sided noise power spectral density, $N_0$. Transmission over an additive white Gaussian noise (AWGN) channel and binary antipodal signaling were assumed. Enhanced max-log a posteriori probability (APP) decoding with an extrinsic information scale factor of 0.8 and 16 full iterations (i.e., 32 soft-in soft-out (SISO) decoding operations) were used. The decoder is instructed to explore the L desired bits in P1' by the insertion of large corresponding value at their positions in P1'.

Using this simple example, which adds extra complexity of 684/(2192−684)=45%, a PER of about $10^{-7}$ and BER of about $10^{-9}$ is archived at a moderate SNR value of 1.4 dB for rate ⅓.

An Exemplary Environment

Figure 8:
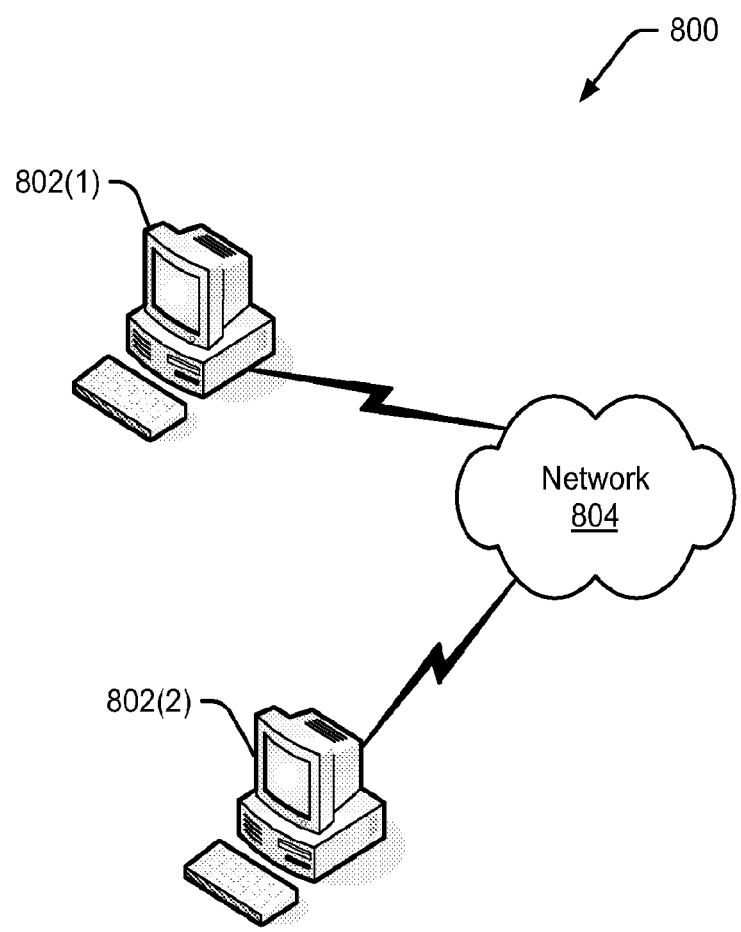
FIG. 8 is a block diagram showing an exemplary environment for implementing systems and methods for encoding and decoding, according to one embodiment.

FIG. 8 is a block diagram illustrating an example environment 800 capable of implementing the systems and methods described herein, according to one embodiment. In a particular implementation, computing systems 802(1) and 802(2) represent respective general-purpose computing devices in environment 800. Computing systems 802(1) and 802(2) represent any type of computing device, such as servers, workstations, laptop computers, tablet computers, handheld computing devices, smart phones, personal digital assistants, game consoles, set top boxes, and the like.

In this particular implementation, computing systems 802(1) and 802(2) communicate via a data communication network 804, such as a local area network (LAN), wide area network (WAN), Wireless Networks, or the Internet. In particular embodiments, data communication network 804 is a combination of multiple networks communicating data using various protocols across any communication medium. Although two computing systems (802(1) and 802(2)) are illustrated, any number of computing systems can be linked together via any number of data communication networks and/or communication links.

An Exemplary Procedure

Figure 9:
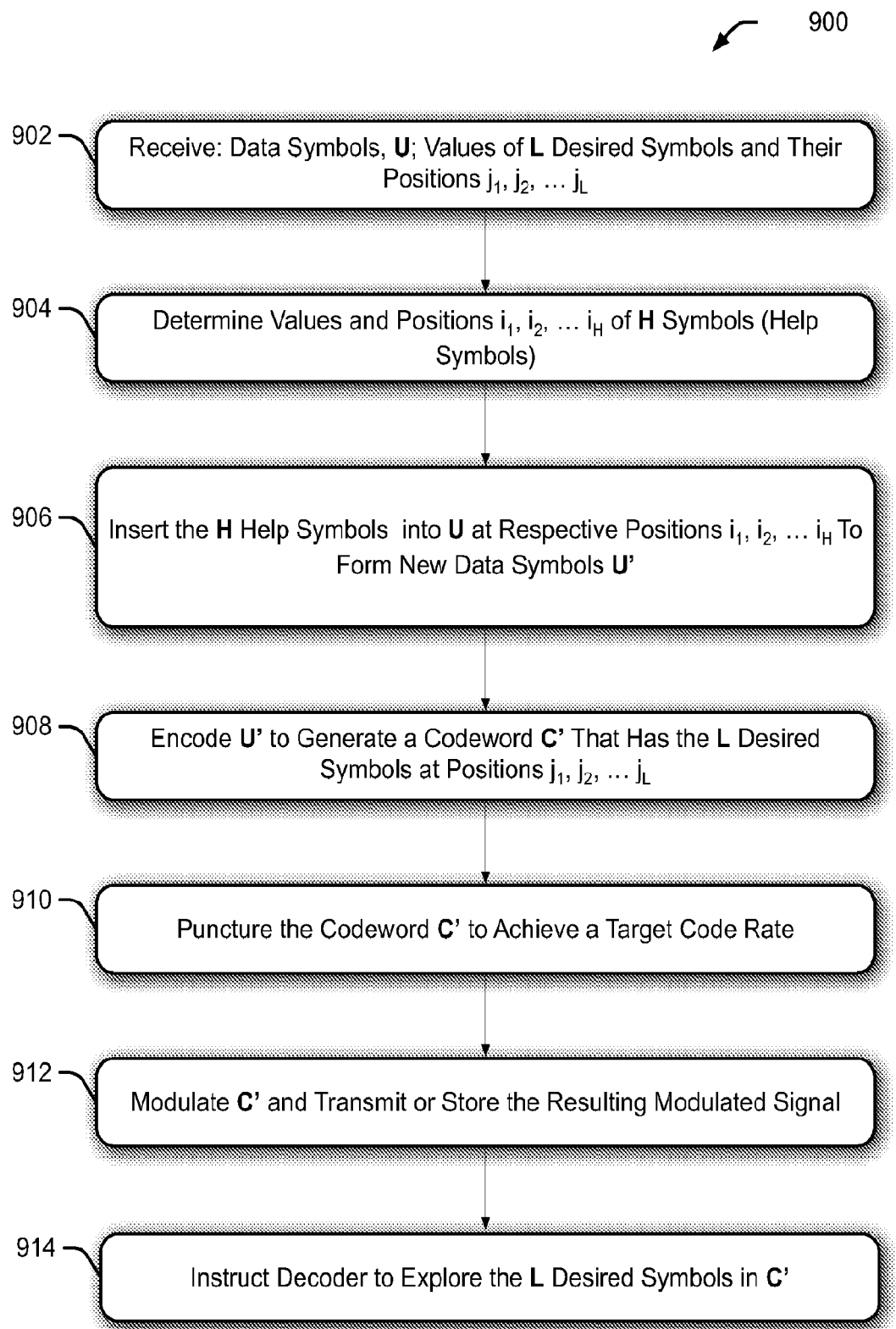
FIG. 9 is a block diagram showing an exemplary procedure for encoding and decoding, according to one embodiment.

FIG. 9 is a flowchart illustrating an exemplary procedure 900 for improving error rate performance, according to one embodiment. The encoding/decoding operations of procedure 900 may be for turbo coding/decoding, low-density parity check code encoding/decoding, or turbo product code encoding/decoding. More particularly, operations of block 902 receive a set of data symbols U for encoding as well as the values and positions $j_1, j_2, \ldots j_L$ of the L desired symbols. For purposes of this exemplary procedure, the values and positions $j_1, j_2, \ldots j_L$ of the L desired symbols have already been established. In one implementation, the values and positions are established based on distance properties obtained from distance measurement methods and/or error rate performance results. In one embodiment, the positions pertain to a parity part P of the resulting codeword. The positions may even be independent of the parity part of the resulting codeword.

Operations of block 904 determine values and positions $i_1, i_2, \ldots i_H$ of the H a priori unknown symbols (help symbols) based on the data symbols U as well as the values and positions $j_1, j_2, \ldots j_L$ of the L desired symbols.

Operations of block 906 insert the H help symbols into the data symbols U to form new data symbols U' that have the H help symbols located at position $i_1, i_2, \ldots i_H$. Operations of block 908 encode the new data symbols U' to generate a codeword C'. Operations of block 910 puncture the codeword to achieve a target code rate (e.g., an original or a lower code rate), if needed. Operations of block 912 modulate C', and in one implementation, transmit or record/store (for example, on magnetic tapes, floppy disks, hard disk drives, CD-ROM's, DVD's, and the like) the resulting modulated signal, over a transmission channel or medium. Operations of block 914 instruct decoder to explore the L desired symbols in the codeword C' to decode C' and generate a decoded result.

Note that the block 904 must determine values and positions $i_1, i_2, \ldots i_H$ of the H symbols such that codeword C' contains the L desired symbols at positions $j_1, j_2, \ldots j_L$. Further, note that the L desired symbols in C' are not transmitted because it is assumed that after the completion of Phase I (discussed earlier), encoder shares with the decoder the values and positions of the L desired symbols.

In one implementation, the encoding and decoding operations are implemented on a single computing device. In another implementation, encoding and decoding operations are implemented respectively on different computing devices (e.g., a first device that encodes the data to generate a codeword and a second device that decodes the codeword for data presentation to a viewer, further data manipulations, and/or so on).

An Exemplary Computing Device

Figure 10:
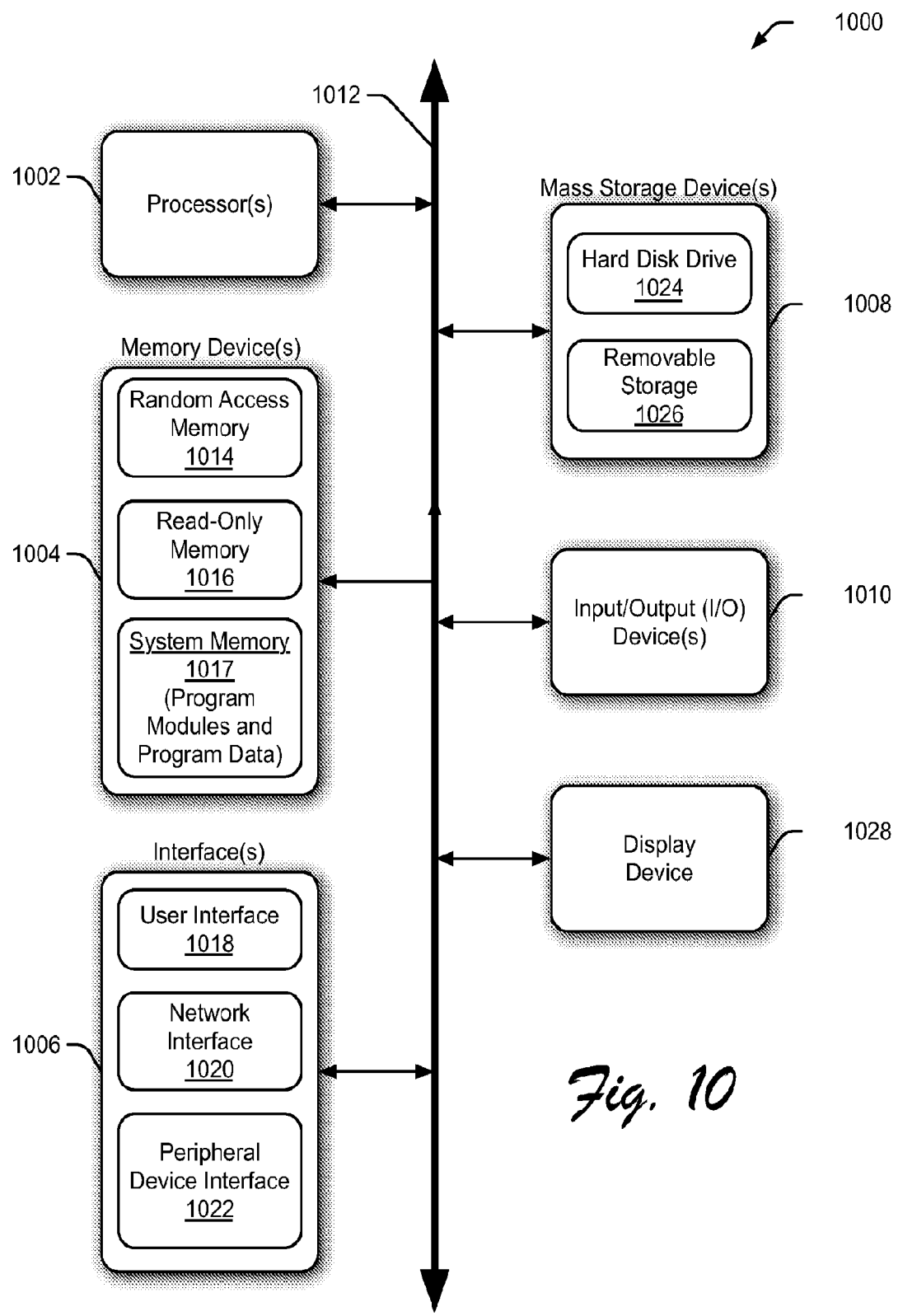
FIG. 10 is a block diagram illustrating an exemplary computing device on which encoding and/or decoding operations may be implemented, according to one embodiment.

FIG. 10 is a block diagram illustrating an exemplary computing device 1000. Computing device 1000 represents an exemplary implementation of a computing devices 502 of FIGS. 5 and 602 of FIG. 6, and may be used to perform various procedures described herein, for example, those associated with the encoding and decoding systems of FIGS. 4, 5, and 6. Computing device 1000 can function as a server, a client, a worker node, or any other computing entity. Computing device 1000 can be any of a wide variety of computing devices, such as a desktop computer, a notebook computer, a server computer, a handheld computer, and the like. Computing device 1000 includes one or more processor(s) 1002, one or more memory device(s) 1004, one or more interface(s) 1006, one or more mass storage device(s) 1008, and one or more Input/Output (I/O) device(s) 1010, all of which are coupled to a bus 1012. In one implementation, computing device 1000 is operatively coupled to a display device 1028. Processor(s) 1002 include one or more processors or controllers that execute instructions stored in memory device(s) 1004 and/or mass storage device(s) 1008. Processor(s) 1002 may also include various types of computer-readable media, such as cache memory.

Memory device(s) 1004 include various computer-readable media, such as volatile memory (e.g., random access memory (RAM)) 1014 and/or nonvolatile memory (e.g., read-only memory (ROM) 1016) and system memory comprising computer-program modules and program data. Computer-program modules include computer program instructions executable by the processor to perform the operations described herein. Memory device(s) 1004 may also include rewritable ROM, such as Flash memory. Mass storage device(s) 1008 include various computer readable media, such as magnetic tapes, magnetic disks, optical disks, solid state memory (e.g., Flash memory), and so forth. As shown in FIG. 10, a particular mass storage device is a hard disk drive 1024. Various drives may also be included in mass storage device(s) 1008 to enable reading from and/or writing to the various computer readable media. Mass storage device(s) 1008 include removable media 1026 and/or non-removable media.

I/O device(s) 1010 include various devices that allow data and/or other information to be input to or retrieved from computing device 1000. Example I/O device(s) 1010 include cursor control devices, keyboards, keypads, microphones, voice-recognition, monitors or other display devices, speakers, printers, network interface cards, modems, lenses, CCDs or other image capture devices, and the like. Display device 1028 includes any type of device capable of displaying information to one or more users of computing device 1000. Examples of display device 1028 include a monitor, display terminal, video projection device, and the like.

Interface(s) 1006 include various interfaces that allow computing device 1000 to interact with other systems, devices, or computing environments. Example interface(s) 1006 include any number of different network interfaces 1020, such as interfaces to local area networks (LANs), wide area networks (WANs), wireless networks, and the Internet. Other interfaces include user interface 1018 and peripheral device interface 1022. Bus 1012 allows processor(s) 1002, memory device(s) 1004, interface(s) 1006, mass storage device(s) 1008, and I/O device(s) 1010 to communicate with one another, as well as other devices or components coupled to bus 1012. Bus 1012 represents one or more of several types of bus structures, such as a system bus, PCI bus, IEEE bus, USB bus, and so forth.

For purposes of illustration, programs and other executable program components are shown herein as discrete blocks, although it is understood that such programs and components may reside at various times in different storage components of computing device 1000, and are executed by processor(s) 1002. Alternatively, the systems and procedures described herein can be implemented in hardware, or a combination of hardware, software, and/or firmware. For example, one or more application specific integrated circuits (ASICs) can be programmed to carry out one or more of the systems and procedures described herein.

Alternate Embodiments

Although the systems and methodologies for joint encoding and decoding methods for improving the error rate performance have been described in language specific to structural features and/or methodological operations or actions, it is understood that the implementations defined in the appended claims are not necessarily limited to the specific features or actions described. For example, although the described systems and methods do not require the use of cyclic redundancy checks (CRC) code or other error detection methods, in one implementation, an error detection method is used. Accordingly, the specific features and operations of the described systems and methods to improve error rate performance are disclosed as exemplary forms of implementing the claimed subject matter.

The invention claimed is:

1. A computer-implemented data encoding method comprising the steps of:
   receiving data symbols U consisting of Z symbols (where, Z=K+T data symbols, K information symbols and T overhead symbols for error detection and/or trellis termination for convolutional and turbo codes);
   determining size of the data symbols U;
   communicating said size of the data symbols U as input to a tuner;
   wherein said tuner performs the steps of:
   (a) outputting a priori a size of L desired symbols to a decoder;
   (b) outputting a priori values of the L desired symbols to the decoder;
   (c) outputting a priori positions $j_1, j_2, \ldots j_L$ of the L desired symbols to the decoder, the size, values and positions of the L desired symbols being alternatively determined by distance measurement methods and by error rate performance results;
   communicating the data symbols U, and the size, values and positions of the L desired symbols to the input of an encoder insertion unit;
   wherein said encoder insertion unit performs the steps of:
   forming new data symbols U' at its output, said U' consisting of Z'=Z+H symbols, said H symbols being inserted into U' at positions $i_1, i_2, \ldots i_H$, and wherein the size, values, and positions of the L desired symbols determining said H symbols and positions $i_1, i_2, \ldots i_H$;
   encoding the new data symbols U' to form a codeword C'; and
   transmitting over a communications channel the codeword C'.

2. The computer-implemented data encoding method, according to claim 1 further comprising the step of choosing the quantities of (a) (b) (c) of claim 1 such that Hamming distance spectra of a new code with the codeword C' are better than Hamming distance spectra of a standard code C.

3. The computer-implemented data encoding method, according to claim 2 further comprising the step of puncturing the codeword C' by removing some symbols in C' thereby achieving a target rate of C'.

4. The computer-implemented data encoding method, according to claim 2 further comprising the step of data decoding, wherein the data decoding comprising the steps of:
   receiving from an encoder as a priori information A, size, values and positions of L desired symbols determined at the encoder;
   communicating the a priori information A to a first input of a decoder instruction unit;
   communicating recorded values V, from a codeword C' transmitted by the encoder, to a second input of the decoder instruction unit;
   wherein the decoder instruction unit performs the steps of:
   outputting an adjusted recorded values V'; and
   outputting an adjusted a priori information A'; and
   wherein a SISO (Soft Input Soft Output) decoder performs the steps of:
   accepting V' and A' as inputs; and
   outputting Decision information and Reliability information about the codeword C'.

* * * * *